United States Patent
Tanaka et al.

[11] Patent Number: 6,158,075
[45] Date of Patent: Dec. 12, 2000

[54] APPARATUS AND METHOD FOR WASHING SUBSTRATE

[75] Inventors: Hideya Tanaka; Kenichi Miyamoto, both of Kumamoto; Minoru Kubota, Ozumachi; Walter Swanson, Kikuyomachi, all of Japan

[73] Assignee: Tokyo Electron Limited, Tokyo, Japan

[21] Appl. No.: 08/970,617

[22] Filed: Nov. 14, 1997

[30] Foreign Application Priority Data

Nov. 19, 1996 [JP] Japan ................................. 8-323404

[51] Int. Cl.$^7$ ................................................. A47L 25/00
[52] U.S. Cl. .............................. 15/102; 15/77; 15/88.2; 134/902; 134/6
[58] Field of Search ......................... 15/77, 88.2, 21.1, 15/97.1, 102, 230, 230.18; 134/6, 902, 1.3, 1, 2, 3

[56] References Cited

U.S. PATENT DOCUMENTS

| | | |
|---|---|---|
| 4,476,601 | 10/1984 | Oka . |
| 5,169,408 | 12/1992 | Biggerstaff et al. . |
| 5,311,634 | 5/1994 | Andros ..................... 15/97.1 |
| 5,345,639 | 9/1994 | Tanoue et al. . |
| 5,375,291 | 12/1994 | Tateyama et al. . |
| 5,518,542 | 5/1996 | Matsukawa et al. . |
| 5,624,501 | 4/1997 | Gill, Jr. ........................ 134/6 |
| 5,636,401 | 6/1997 | Yonemizu et al. ........... 15/77 |
| 5,647,083 | 7/1997 | Sugimoto et al. ............ 15/77 |
| 5,664,254 | 9/1997 | Ohkura et al. . |
| 5,685,039 | 11/1997 | Hamada et al. . |
| 5,778,481 | 7/1998 | Amsden et al. ........ 15/230.16 |
| 5,868,866 | 2/1999 | Maekawa et al. ........... 134/34 |
| 5,870,792 | 2/1999 | Shurliff ...................... 15/102 |
| 5,906,687 | 5/1999 | Masui et al. ............... 134/1.3 |
| 6,006,391 | 12/1999 | Shurliff et al. ............. 15/102 |

FOREIGN PATENT DOCUMENTS

| | | |
|---|---|---|
| 0 718 871 | 6/1996 | European Pat. Off. . |
| 0 876 853 | 11/1998 | European Pat. Off. . |
| 2 589 089 | 4/1987 | France . |
| 58-182830 | 10/1983 | Japan . |
| 6-190346 | 7/1994 | Japan . |
| 10-092780 | 4/1998 | Japan . |

*Primary Examiner*—Alexander Markoff
*Attorney, Agent, or Firm*—Oblon, Spivak, McClelland, Maier & Neustadt, P.C.

[57] ABSTRACT

A substrate washing apparatus, comprising a spin chuck for holding and rotating a substrate W, a brushing section including a scrubbing member which is brought into contact with a washing surface of the substrate held on the spin chuck and revolved on its own axis together with rotation of the spin chuck, a washing liquid supply mechanism for supplying a washing liquid through the brushing section onto the washing surface of the substrate, a pressure control mechanism for controlling a pressing force of the scrubbing member against the washing surface of the substrate, and a moving means for moving the scrubbing member relative to the substrate in a radial direction of the substrate, wherein the scrubbing member includes an abutting portion which is brought into contact with the washing surface of the substrate, and a non-contact peripheral portion positioned about the abutting portion and formed not to contact the washing surface of the substrate when the abutting portion is in contact with the washing surface of the substrate.

13 Claims, 8 Drawing Sheets

APPARATUS AND METHOD FOR WASHING SUBSTRATE

BACKGROUND OF THE INVENTION

1. Field of the Invention

The present invention relates to an apparatus and method for washing a substrate, in which a substrate such as a semiconductor wafer or an LCD substrate is washed by scrubbing.

2. Discussion of the Background

In a process of manufacturing a semiconductor device such as an LSI, a surface of a wafer on which a circuit pattern is formed is required to maintain a strictly high cleanliness, making it necessary to wash the wafer surface frequently both before and after various process steps. Particularly, in a photolithography process, it is absolutely necessary to apply a washing treatment to a wafer surface.

A scrubber disclosed in, for example, Japanese Patent Disclosure (Kokai) No. 57-102024 or Japanese Patent Disclosure No. 62-259447 is used in the photolithography process for scrubbing the wafer surface for the washing purpose. In the scrubber disclosed in these prior art, a washing liquid is supplied onto a surface of a wafer revolved on its own axis. Also, a washing member such as a brush or sponge, which is kept rotated, is brought into contact with the revolving wafer surface so as to remove the foreign matter attached to the wafer surface.

FIGS. 1 and 2 collectively show a conventional front face washing section 101. As shown in the drawings, the front face washing section 101 comprises a holder 103 having a washing liquid supply hole 102 formed in a central portion, and 6 washing members 104 held by the holder 103. The washing section 101 is supported by a support mechanism (not shown) so as to be rotatable on its own axis and movable in a vertical direction. The washing member 104 consists of a columnar sponge having a tip portion cut to form a flat surface. A washing liquid such as pure water is supplied through the washing liquid supply hole 102 into each of the washing members 104 while the washing section 101 is kept revolved on its own axis. Under this condition, the tip portions of the washing members 104 are pressed against a front face, i.e., circuit pattern-forming face, of a wafer which is kept revolved on its own axis, so as to cleanse the wafer front face.

FIGS. 3 and 4 collectively show a conventional rear face washing section 111. As shown in the drawings, the washing section 111 comprises a holder 112 having a washing liquid supply hole 115 formed in a central portion and a plurality of washing members 113, 114. The washing section 111 is supported by a supporting mechanism (not shown) so as to be rotatable on its own axis and movable in a vertical direction. The washing members consist of 8 brushes 113 and 4 sponges 114. These brushes 113 and sponges 114 are used in combination in the conventional rear face washing section 111 partly because the rear face of the wafer tends to be stained more severely than the front face and partly because the rear face can be scrubbed more strongly than the front face. Each of these brushes 113 and sponges 114 has its tip portion cut to form a flat surface which is brought into contact with the wafer surface. A washing liquid such as pure water is supplied through the washing liquid supply hole 115 onto each of the washing members 113, 114, while revolving the washing section 111 on its own axis. Under this condition, the washing members 113, 114 are pressed against a rear face (back face opposite to the circuit pattern-forming face), of the wafer W which is kept revolved on its own axis so as to cleanse the rear face of the wafer W.

In the conventional scrubbers 101, 111 shown in FIGS. 1 to 4, only a slight inclination of the supporting arm (not shown) causes the tip portions (wafer-contact portions) of the sponges 104, 114 to fail to be brought into contact uniformly with the wafer faces. In other words, peripheral portions alone of the sponges 104, 114 are strongly pressed against the wafer faces. Since the contact pressure between the sponges 104, 114 and the wafer face is locally concentrated, the entire wafer face cannot be washed uniformly. In addition, stains are attached to and remain on the peripheral portions alone of the sponges 104, 114. It follows that, if these sponges 104, 114 are used repeatedly, a serious problem is brought about that the wafer faces are stained.

BRIEF SUMMARY OF THE INVENTION

An object of the present invention is to provide an apparatus and method for washing a substrate, which is effective for preventing a mutual pressing force between a scrubbing member and a substrate surface from being locally concentrated and permits allowing a substrate-contact portion of the scrubbing member to be kept clean.

According to an aspect of the present invention, there is provided a substrate washing apparatus, comprising:

a spin chuck for holding and rotating a substrate;

a brushing section including a scrubbing member which is brought into contact with a washing surface of the substrate held on the spin chuck and revolved on its own axis together with rotation of the spin chuck;

a washing liquid supply mechanism for supplying a washing liquid through the brushing section onto the washing surface of the substrate;

a pressure control mechanism for controlling a pressing force of the scrubbing member against the washing surface of the substrate; and a moving means for moving the scrubbing member relative to the substrate in a radial direction of the substrate, wherein the scrubbing member includes:

an abutting section which is brought into contact with the washing surface of the substrate; and a non-contact peripheral section positioned about the abutting section and formed not to contact the washing surface of the substrate when the abutting section is in contact with the washing surface of the substrate.

If the non-contact peripheral section of the scrubbing member is curved in three dimensional directions to form a hemispherical configuration, the pressure concentration can be suppressed. Therefore, even if an arm supporting, for example, a washing member is inclined, the contact pressure can be made uniform over the entire contact region between the washing member and the washing surface of the substrate.

It is desirable for the sponge portion of the scrubbing member to be formed of a foamed polyvinyl alcohol (PVA) or a foamed polyvinyl formal (PVF).

In the present invention, the supply pressure of the washing liquid is variable, making it possible to control the swelling degree of the washing member by varying the supply pressure and, thus, to control the contact pressure of the washing member against the substrate.

According to another aspect of the present invention, there is provided a method of washing a substrate, comprising the steps of (a) arranging in a waiting section a scrubbing member including an abutting section which is brought into contact with a washing surface of the substrate, and a non-contact peripheral section positioned about the abutting section and formed not to contact the washing surface of the substrate when the abutting section is in contact with the washing surface of the substrate, the waiting section being positioned outside of a spin chuck and provided with a cleaner member for removing stains from the scrubbing member to cleanse the scrubbing member, (b) mounting a substrate on the spin chuck, (c) rotating the substrate together with the spin chuck, (d) moving the scrubbing member from the waiting section to an operating section near the substrate to permit the abutting section of the scrubbing member to be brought into contact with a washing surface of the rotating substrate, and supplying a washing liquid through the scrubbing member onto the washing surface of the substrate, (e) moving the scrubbing member relative to the substrate in a radial direction of the substrate while the abutting section of the scrubbing member is in contact with the washing surface of the substrate so as to have the washing surface of the substrate scrubbed with the abutting section, and (f) bringing the scrubbing member after the scrubbing operation back into the waiting section and rotating the scrubbing member about its own axis in contact with the cleaner member of the waiting section, the washing liquid being spurted outward from inside the scrubbing member during revolution of the scrubbing member in the waiting section so as to remove stains from the scrubbing member.

In the washing method of the present invention, the washing member itself is washed while the washing member is positioned in the waiting section. Also, the dust or the like attached to the surface of the washing member is removed by a washing liquid spurted from within the washing member to flow to the outside through the washing member. Further, vibration is imparted to the washing liquid, making it possible to wash effectively the washing member itself.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Let us describe various preferred embodiments of the present invention with reference to the accompanying drawings. The embodiments described below cover the cases where the technical idea of the present invention is employed in a washing system for washing a semiconductor wafer.

Figure 5:
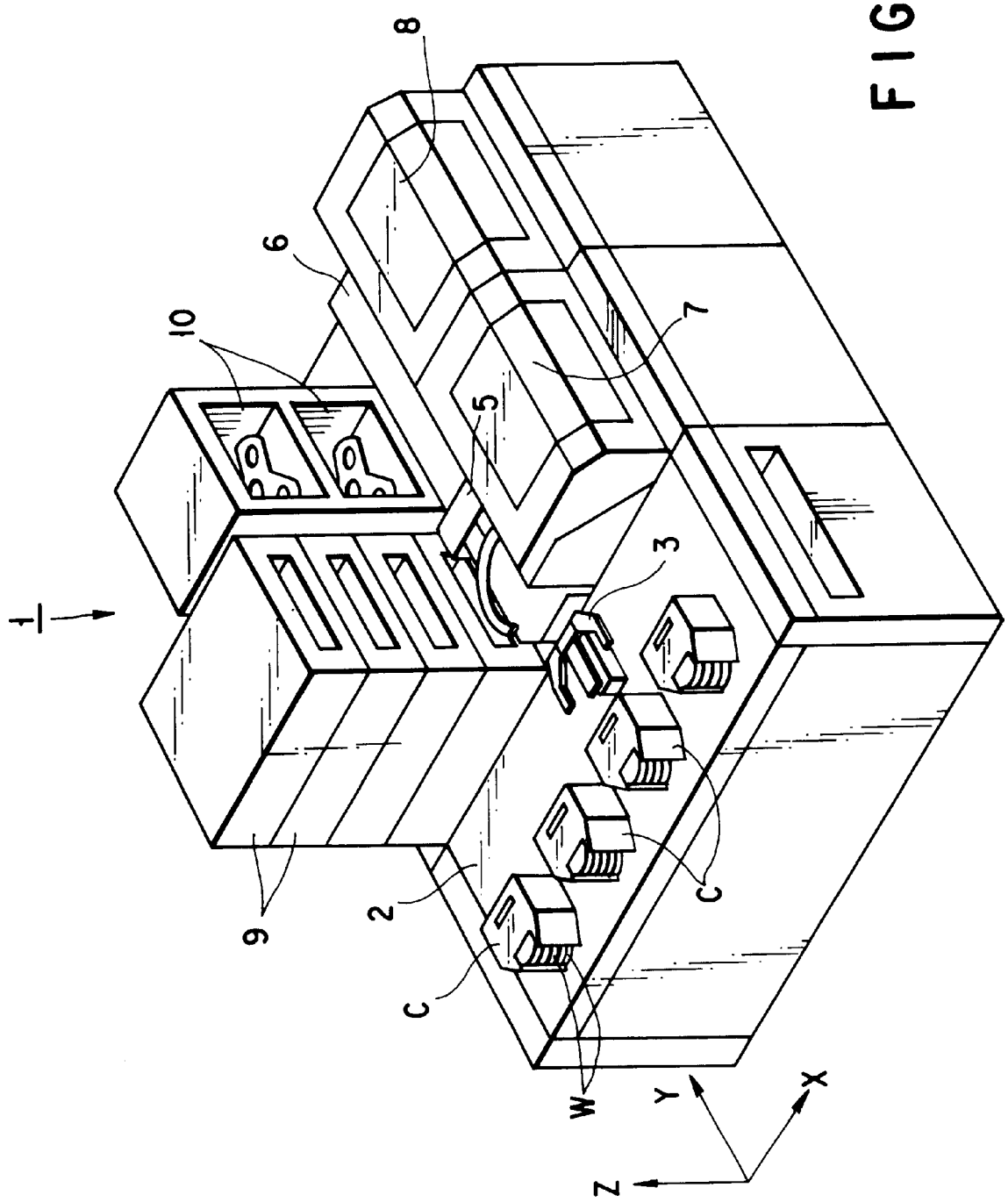
FIG. 5 is an oblique view showing a wafer washing system provided with a washing apparatus.

Specifically, FIG. 5 shows a washing system 1 provided with washing apparatuses 7 and 8. As shown in the drawing, the system 1 comprises a cassette station 2 on which are arranged a plurality of cassettes C each housing a plurality of wafers W. A sub-arm mechanism 3 serving to align the cassettes C at predetermined positions and transferring the wafers W into and out of the cassettes C is mounted in a central portion of the cassette station 2. A main arm mechanism 5 is mounted behind the sub-arm mechanism 3. The wafers W are delivered by the main arm mechanism 5 between the sub-arm mechanism 3 and each of the process units included in the washing system 1. The main arm mechanism 5 is movable along a transfer path 6 formed in a central portion of the washing system 1.

Various process units are arranged on both sides of the transfer path 6. Specifically, arranged side by side on one side of the transfer path 6 are a first washing apparatus (front face washing apparatus) 7 for washing a front face of a wafer W and a second washing apparatus (rear face washing apparatus) 8 for washing a rear face of the wafer W. Also, four heating devices 9 for heating and drying the wafer W are stacked one upon the other on the other side of the transfer path 6. Further, two wafer inverting devices 10, which are stacked one upon the other, are arranged adjacent to the heating devices 9.

Figure 1:
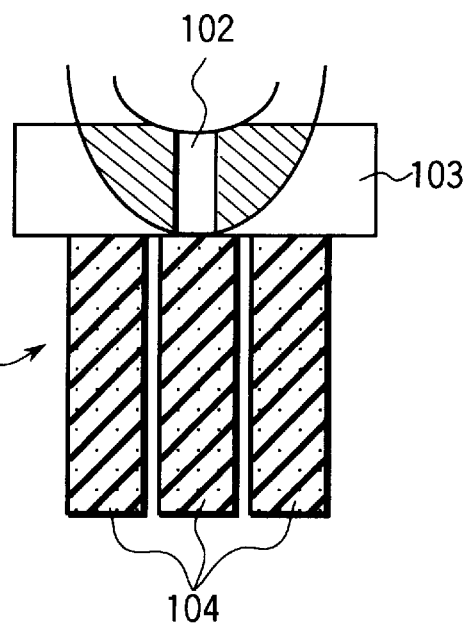
FIG. 1 is a front view showing a conventional front face scrubbing member.
Figure 2:
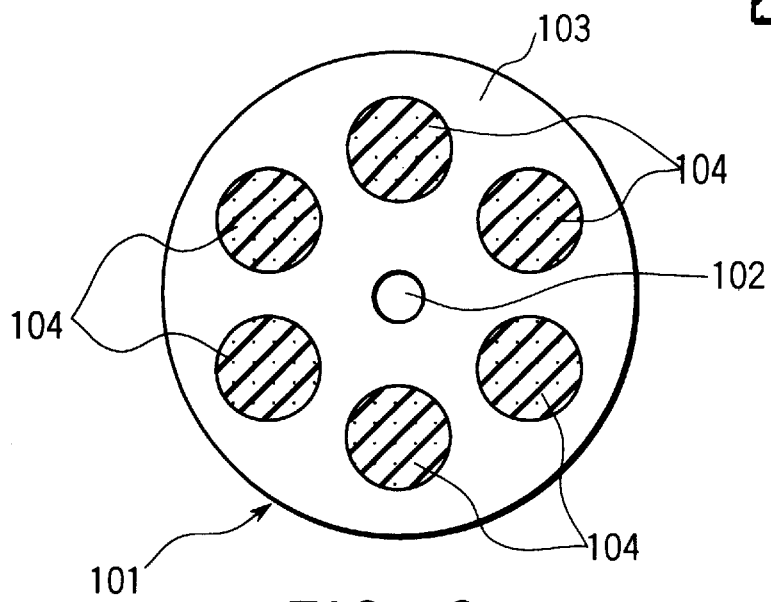
FIG. 2 is a bottom view showing the conventional front face scrubbing member shown in FIG. 1.
Figure 3:
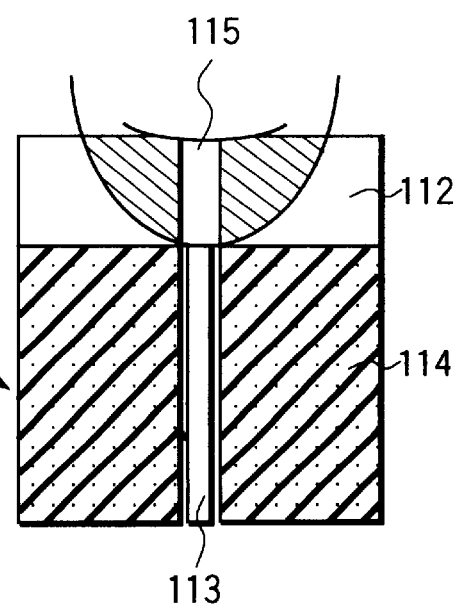
FIG. 3 is a front view showing a conventional rear face scrubbing member.
Figure 4:
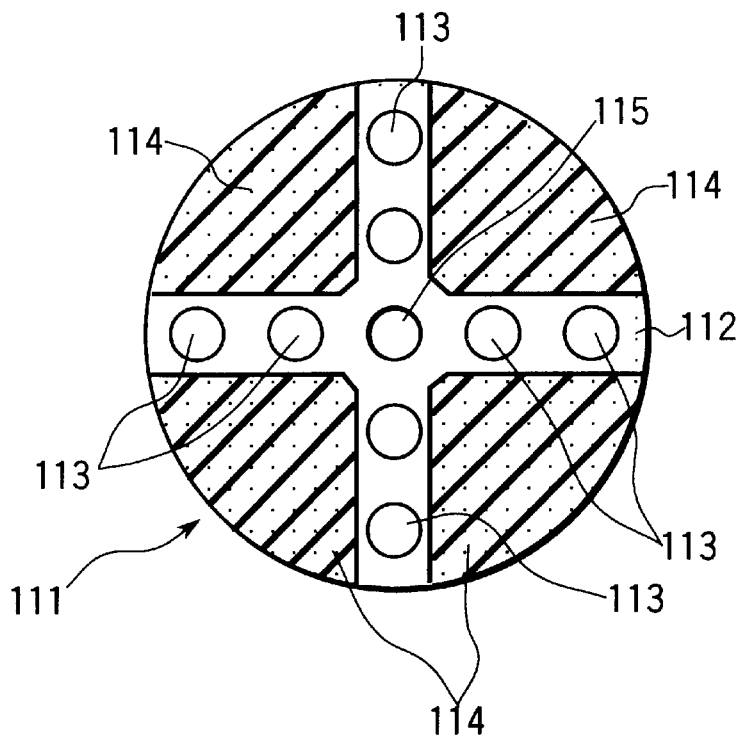
FIG. 4 is a bottom view showing the conventional rear face scrubbing member shown in FIG. 3.
Figure 7:
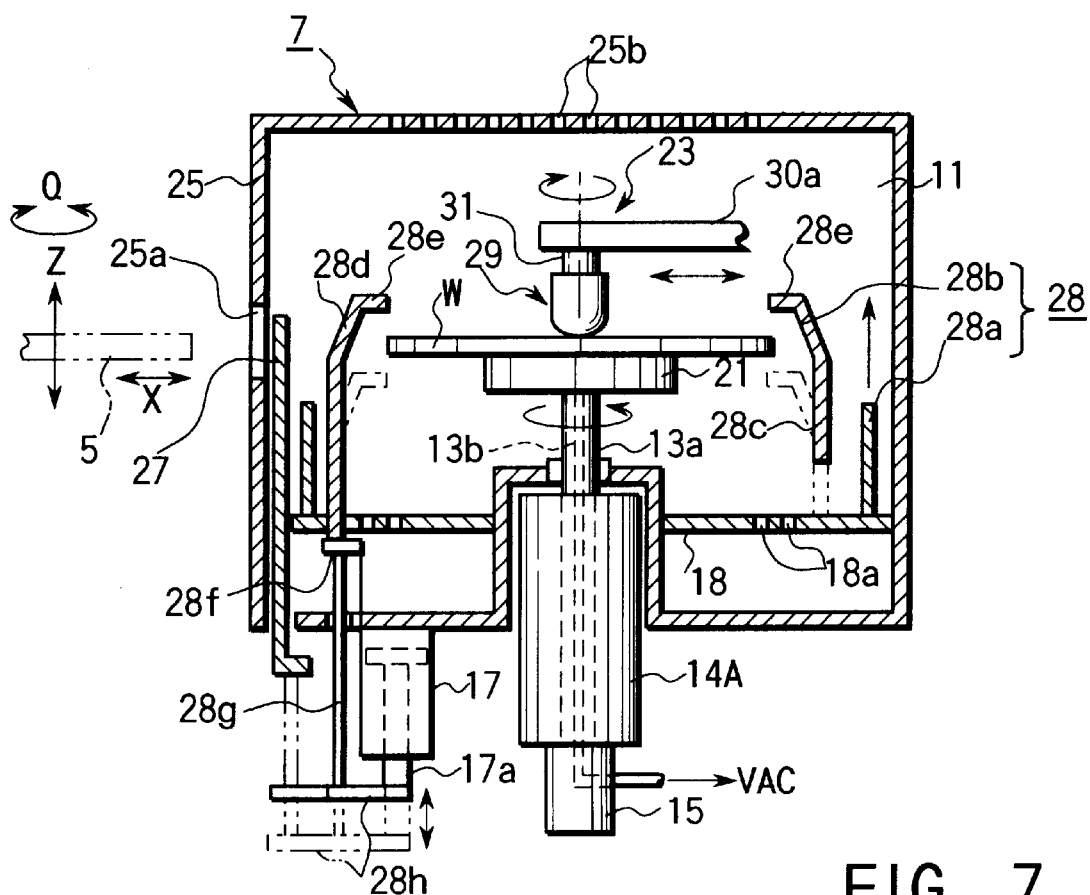
FIG. 7 is a perspective cross sectional view showing the substrate washing apparatus shown in FIG. 6.
Figure 6:
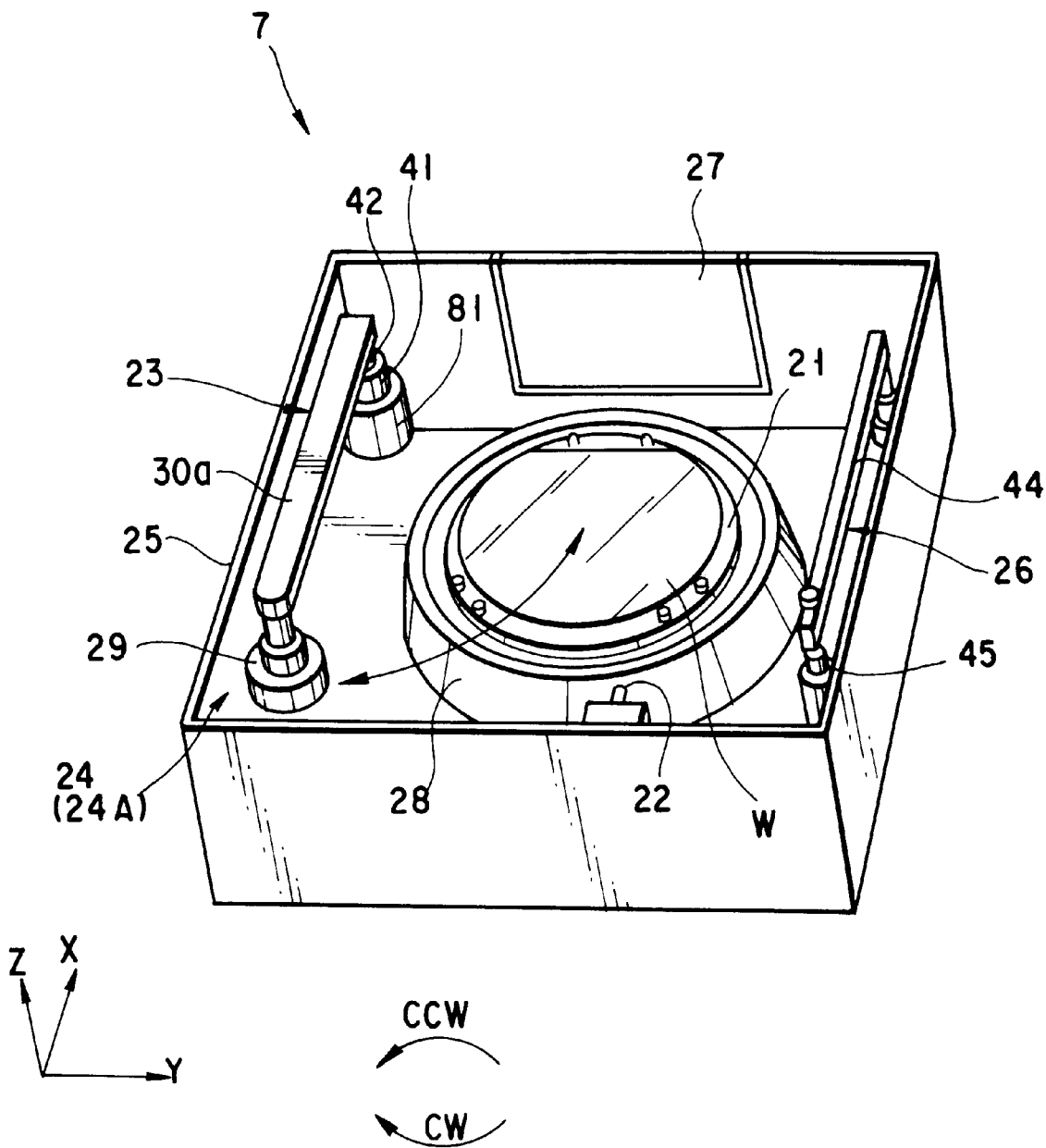
FIG. 6 is an oblique view showing a substrate washing apparatus according to one embodiment of the present invention.

As shown in FIGS. 6 and 7, the first washing apparatus 7 comprises a spin chuck 21, a nozzle 22, a scrubber mechanism 23, a brushing section cleaning device 24, and a megasonic nozzle 26. The wafer W is held by vacuum suction by the spin chuck 21 such that the front face thereof faces upward and is revolved together with the spin chuck 21. A washing liquid, e.g., pure water, is supplied from the nozzle 22 onto the wafer W held by the spin chuck 21. The scrubber mechanism 23 includes a brushing section 29 which is brought into contact with the front face of the revolving wafer W so as to wash the front face of the wafer W. The brushing section cleaning device 24 is arranged in a home position apart from the spin chuck 21 so as to wash the brushing section 29 positioned in the home position apart from an operating position. Further, the megasonic nozzle 26 is arranged within a process unit 25 to face the scrubber mechanism 23 with the spin chuck 21 interposed therebetween.

The scrubber mechanism 23 comprises a horizontal arm 30a, a vertical pivotal shaft 42, an arm swinging mechanism 41, and an arm lift mechanism 81 in addition to the brushing section 29. The proximal end of the horizontal arm 30a is supported by the vertical pivotal shaft 42, and the brushing section 29 is mounted to the free end of the horizontal arm 30a. If the horizontal arm 30a is swung about the pivotal shaft 42 by the arm swinging mechanism 41, the brushing section 29 is moved from its home position outward of the spin chuck 21 to the operating position right above the spin chuck 21. In the operating position, the brushing section 29 is reciprocated between a central portion and a peripheral portion of the wafer W held by the spin chuck 21.

The spin chuck 21 is revolved to permit the wafer W held thereon to be rotated in a clockwise direction. A cup 28 is arranged to surround the spin chuck 21 so as to prevent the washing liquid supplied to the wafer surface in the wafer washing step from being scattered around.

As shown in FIG. 7, the process chamber 25 is provided with a transfer port 25a communicating with the transfer path 6. The transfer port 25a is opened or closed by a vertically movable door 27. The wafer W is delivered from the main arm mechanism 5 into the process chamber 25 through the transfer port 25a and, then, disposed on the spin chuck 21 arranged within the process chamber 25. The spin chuck 21 is provided with a vacuum suction mechanism including an exhaust passageway 13b for holding the wafer W. The exhaust passageway 13b extends within a rotary shaft 13a of the spin chuck 21 so as to be open in the upper surface of the spin chuck 21. The rotary shaft 13a is joined to a driving shaft of a motor 14A via a seal bearing.

The cup 28 includes an outer cup 28a and an inner cup 28b concentric with the outer cup 28a. The outer cup 28a stands upright from a bottom plate 18 fixed in a bottom portion of the process chamber 25. On the other hand, the inner cup 28b, which is arranged inside the outer cup 28a, has a tapered portion 28d whose diameter is gradually diminished toward the upper end of the inner cup 28b and a flange portion 28e extending inward from the upper end of the tapered portion 28d.

The inner cup 28b also includes a cylindrical base portion 28c joined to a rod 17a via connector members 28g, 28h. If the rod 17a is vertically moved within a cylinder 17, the inner cup 28b is vertically moved along a Z-axis. The inner cup 28b moved to its highest position surrounds the spin chuck 21 and the wafer W. When the inner cup 28b is moved to its lowest position, the flange portion 28e of the inner cup 28b is positioned lower than the substrate-holding surface of the spin chuck 21.

The door 27 is mounted to the connector member 28h to permit the door 27 to be moved by the movement of the rod 17a within the cylinder 17. It follows that the door 27 is moved up and down in synchronism with the vertical movement of the inner cup 28b.

A large number of air inlet ports 25b are formed in a ceiling portion of the process chamber 25 to permit a clean air to be introduced into the process chamber 25 through these air inlet ports 25b. Likewise, a large number of holes 18a are formed through the bottom plate 18. The waste liquid and waste gas are discharged from within the cup 28 into a drain line (not shown) and an exhaust line (not shown) through these holes 18a.

Figure 8:
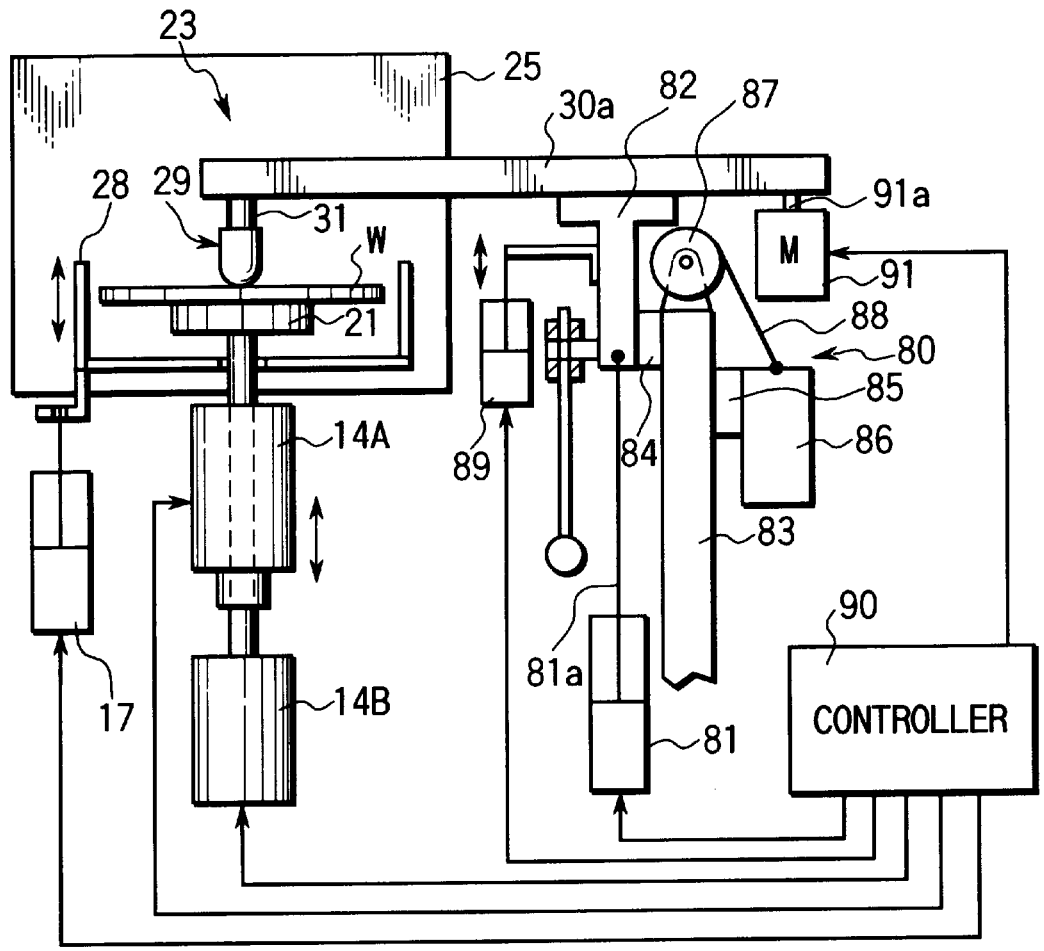
FIG. 8 is a block diagram showing the construction of a pressure control mechanism of a support section of a scrubbing member.
Figure 9:
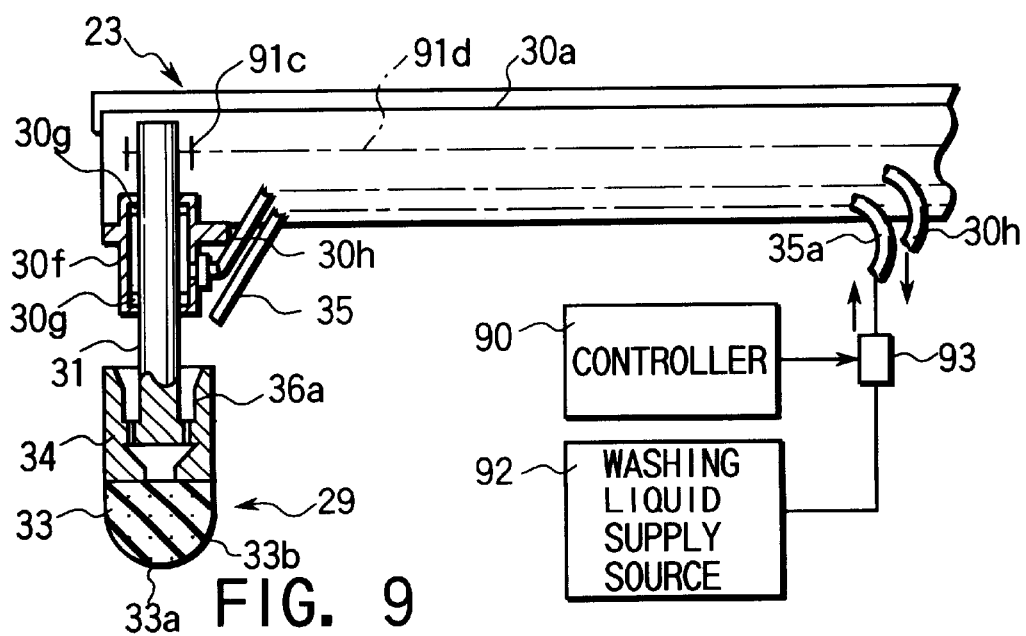
FIG. 9 is a cross sectional view, partly broken away, showing in a magnified fashion the support section of the scrubbing member.

FIGS. 8 and 9 show in detail a scrubber mechanism 23 and the spin chuck 21. As shown in FIG. 8, the spin chuck 21 is rotatably mounted to the driving shaft of the motor 14A. Also, the motor 14A is supported by a vertically movable rod of a cylinder 14b. It follows that, the spin chuck 21 is moved upward, if the rod projects upward from within the cylinder 14B, and is moved downward, if the rod is moved into the cylinder 14B.

The scrubber mechanism 23 comprises a pressure control mechanism 80 and a controller 90. The pressure control mechanism 80, which serves to control the pressing force of the brushing section 29 abutting against the wafer W, comprises a vertically movable cylinder 81 having a rod 81a joined to a suitable point of an arm 30a via a vertically movable connecting member 82. The connecting member 82 is joined to one surface of a vertical wall 83 with a linear guide 84 interposed therebetween.

A balance weight 86 is mounted on the opposite side of the vertical wall 83 with a linear guide 85 interposed therebetween. The balance weight 86 is joined to the connector member 82 via a pulley 87 mounted to the upper end of the vertical wall 83 and a wire 88 extending along the pulley 87.

The balance weight 86 is controlled to be equal to the sum of weights of the brushing section 29 and the arm 30a. A pressurizing cylinder 89, which is joined to the connector member 82, is operated to permit the brushing section 29 to be pressed against the front face of the wafer W. The pressing force of the brushing section 29 is controlled by an air pressure applied to the cylinder 89.

As shown in FIGS. 8 and 9, the brushing section 29 is joined to a driving shaft 91a of a motor 91 via a vertical shaft 31, a pulley 91c and a belt 91d, with the result that the rotating force of the motor 91 is transmitted to the brushing section 29. The vertical shaft 31 is supported by the arm 30a via a pair of bearings 30g within a sleeve 30f. An exhaust tube 30h communicates with the inner space of the sleeve 30f to permit the air within the sleeve 30f to be released to the outside through the exhaust tube 30h. As shown in the drawings, the power sources of the motors 14A, 91 and the cylinders 14B, 17, 81, 89 are connected to the output terminal of the controller 90, with the result that the operation of these motors and cylinders is controlled by the controller 90.

A nozzle 35 communicating with a washing liquid supply source 92 via a supply pipe 35a is mounted to the arm 30a. A pressure control valve 93 is mounted between the nozzle 35 and the washing liquid supply source 92 and, thus, the pressure of the washing liquid supplied to the nozzle 35 is variable. The operation of the pressure control valve 93 is also controlled by the controller 90. The discharge port of the nozzle 35 faces an upper liquid receptacle 36a of the brushing section 29 such that the washing liquid discharged from the nozzle 35 is received by the receptacle 36a.

Figure 10:
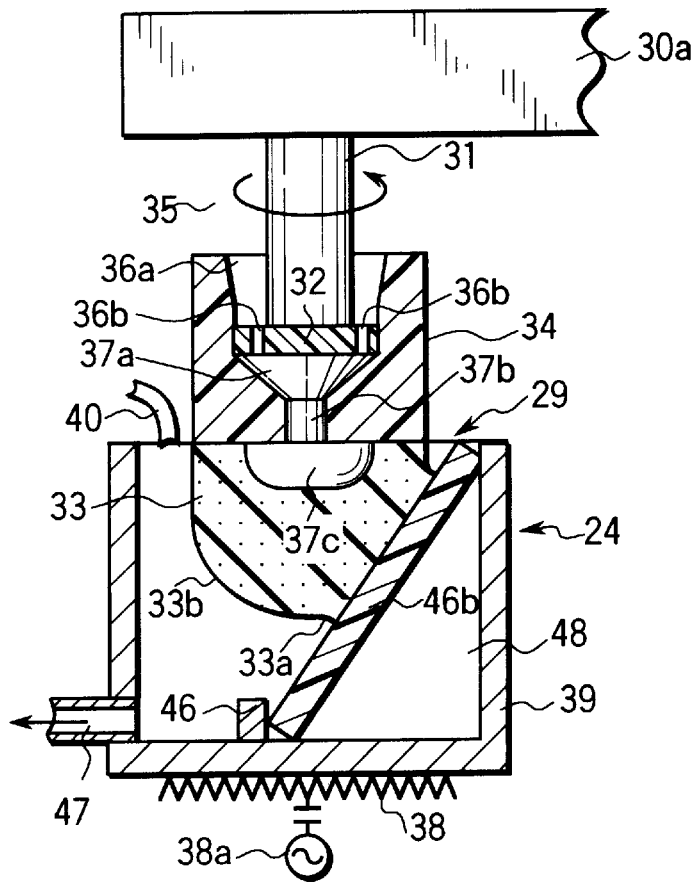
FIG. 10 is a partial cross sectional view showing the front face scrubbing member in its home position and a brush cleaner (cleaning section of a scrubbing member)

As shown in FIG. 10, the brushing section 29 includes a holder 34 which is joined to the lower end of the shaft 31 via a mounting plate 32. Also, a sponge 33 acting as a scrubbing member is detachably mounted to the lower end of the holder 34. The mounting plate 32, which is provided with a plurality of through holes 36b, is fit in the upper liquid receptacle 36a of the holder 34. The upper liquid receptacle 36a communicates via the through holes 36a with a lower tapered portion 37a. Further, the lower tapered portion 37a communicates with a lower liquid receptacle 37c via a supply hole 37b. The washing liquid (pure water) supplied from the nozzle 35 passes within the holder 34 so as to be guided into the lower liquid receptacle 37c and, then, permeates into the sponge 33. Further, the washing liquid held within the sponge 33 comes out of the sponge 33.

The sponge 33, which should be small in change with time in properties and should be soft, is formed of, for example, a foamed polyvinyl alcohol (PVA) or a foamed polyvinyl formal (PVF). For example, the sponge 33 should have an impact resilience of 20 to 80 g/cm$^2$ under 30% of compression stress, should be capable of a maximum water absorption of 1200% and should have an apparent specific gravity of about 0.08. On the other hand, the holder 34 is formed of a resin such as polypropylene.

Figure 11:
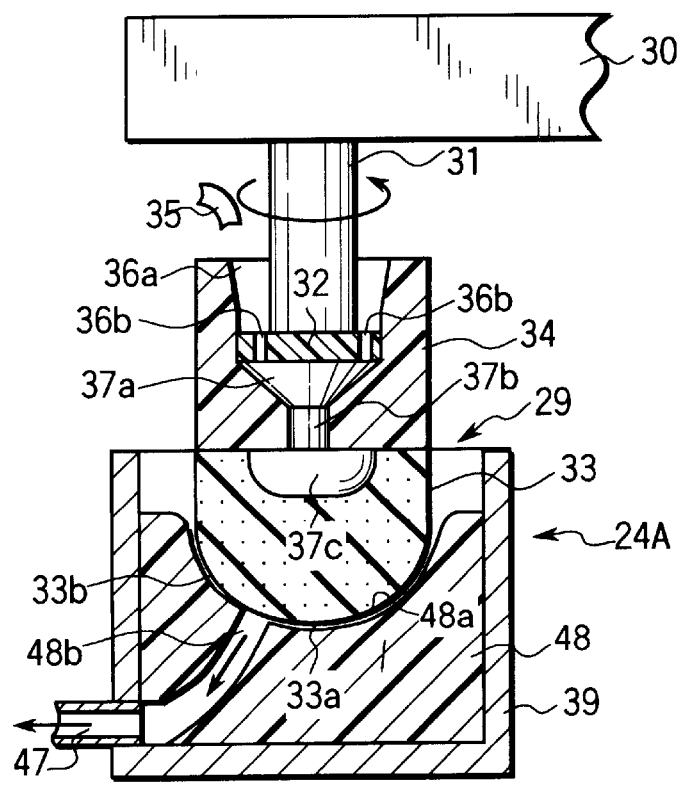
FIG. 11 is a partial cross sectional view showing the front face scrubbing member in its home position and another brush cleaner (cleaning section of a scrubbing member)

As shown in FIGS. 10 and 11, a lower portion of the sponge 33 is shaped hemispherical or pseudo hemispherical, and has a smooth surface free from a corner portion. The sponge (scrubbing member) 33 includes an abutting portion 33a which is brought into contact with the wafer W and a non-contact peripheral portion 33b which is not in contact with the wafer W.

The brushing section cleaning device 24 is arranged in a home position (waiting position) apart from the spin chuck 21, as already described with reference to FIG. 6.

As shown in FIG. 10, the brushing section cleaning device 24 comprises an ultrasonic oscillator 38, a washing liquid reservoir 39, a nozzle 40, and a washing plate (a plate-like cleaner member) 46a. The cleaner member 46a, which is arranged within the washing liquid reservoir 39, is held stationary in an inclined posture by a stopper 46b such that the lower portion of the sponge 33 is pressed against the inclined surface of the cleaner member 46a. It is desirable for the cleaner member 46a to be inclined by 30 to 60°. Further, a drain hole 47 is formed in a bottom portion of the washing liquid reservoir 39. The reservoir 39 is formed of a corrosion resistant alloy or resin.

The sponge 33 of the brushing section 29 is periodically washed in the brushing section cleaning device 24. Specifically, the washing liquid is supplied from the nozzle 40 into the reservoir 39. Under this condition, the sponge 33 is revolved on its own axis and pressed against the cleaner member 46a so as to remove the stains attached to the surface of the sponge 33, thereby cleansing the sponge surface. The cleansing effect of the sponge 33 can be improved, if an ultrasonic wave generated from the ultrasonic wave oscillator 38 is transmitted into the washing liquid within the washing liquid reservoir 39. Incidentally, it is desirable for the cleaner member 46a to be formed of a hard resin such as polypropylene and for the surface of the cleaner member 46a to have fine irregularities.

FIG. 11 shows a brushing section cleaning device 24A having a concave cleaner member 48. In this modification, the cleaner member 48 is fit in the washing liquid reservoir 39. A recess 48a is formed in an upper surface of the cleaner member 48, and a discharge passageway 48b communicating with the drain hole 47 is formed within the cleaner member 48. It is desirable for the cleaner member 48 to be formed of a hard resin such as polypropylene. It is also desirable for the inner surface of the recess 48a of the cleaner member 48 to have fine irregularities.

The front face of the wafer W washed in the scrubber mechanism 23 is further washed by the megasonic nozzle 26 with a washing liquid excited by an ultrasonic wave. The megasonic nozzle 26, which is substantially equal in construction to the scrubber mechanism 23, comprises an arm 44 and a nozzle body 45 mounted to a tip of the arm 44. A washing liquid supply line, which is connected at one end to the nozzle body 45, is connected at the other end to an oscillator (not shown) such that a washing liquid excited by an ultrasonic wave having a predetermined number of vibration is supplied to the nozzle body 45.

Figure 12:
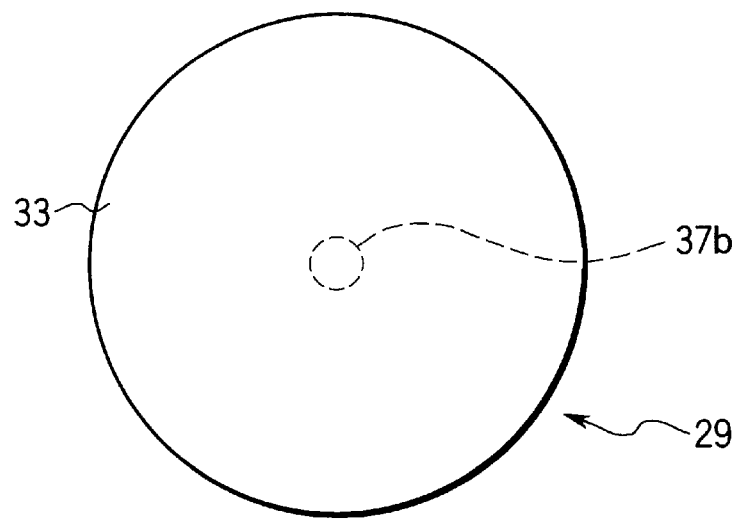
FIG. 12 is a bottom view showing a front face scrubbing member according to another embodiment of the present invention.
Figure 13:
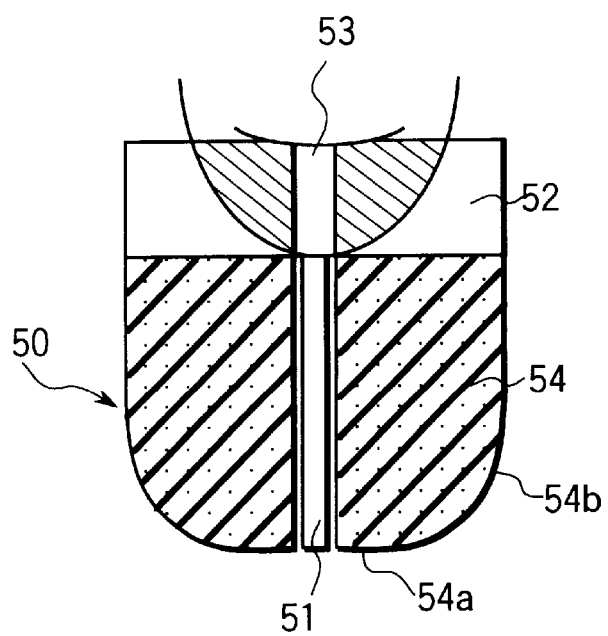
FIG. 13 is a cross sectional view showing a rear face scrubbing member according to another embodiment of the present invention.
Figure 14:
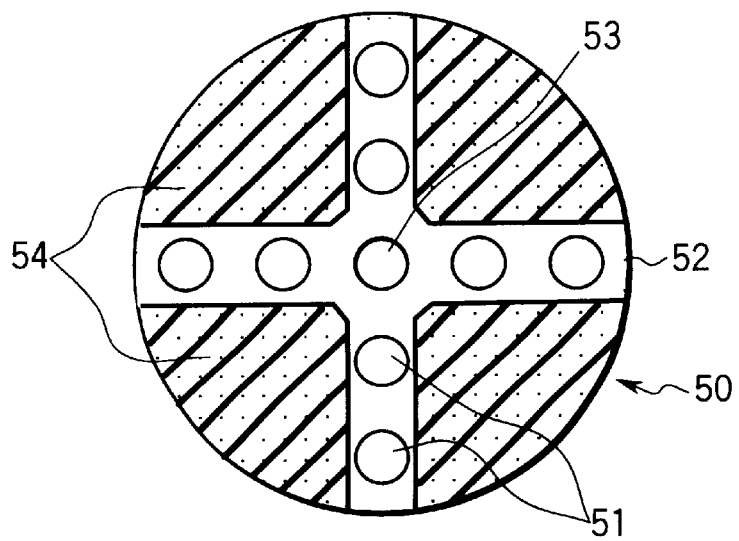
FIG. 14 is a bottom view showing a rear face scrubbing member according to another embodiment of the present invention.
Figure 15:
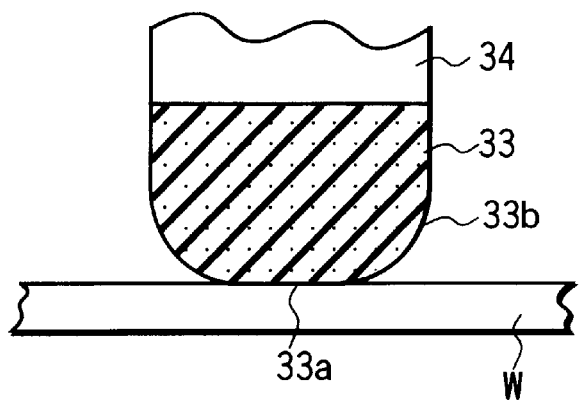
FIG. 15 shows how a scrubbing member is in contact with a wafer.

The rear face washing apparatus 8, which is substantially equal in construction to the front face washing apparatus 7, comprises a brushing section 50 including 4 sponge members 54 and 8 brushing fiber bundles 51 as shown in FIGS. 13 and 14. These sponge members 54 and the brushing fiber bundles 51 are detachably mounted to a holder 52. These sponge members 54 and brushing fiber bundles 51 are radially arranged, with a washing liquid supply hole 53 positioned in the center. To be more specific, these sponge members 54 are partitioned from each other by a cross (+)-shaped space having a predetermined width. Two of the brushing fiber bundles 51 are arranged side by side in each of the four arm portions of the cross-shaped space. If the cross-shaped space is removed to permit the four sponge members 54 to be joined together, the joined structure is shaped like the sponge 33 shown in FIGS. 11 and 12.

The front face washing of the wafer W differs from the rear face washing as follows. Specifically, in washing the front face of the wafer W, it is desirable to move the brushing section 29 in a horizontal direction by vertically rocking the arm 30a without revolving the brushing section 29 on its own axis by operating the motor. In the front face washing, a very subtle contact of the sponge 33 (scrubbing member) with the wafer surface is required in order to prevent the film quality on the wafer surface from being adversely affected. To meet this requirement, the brushing section 29 is reciprocated between the central portion and a peripheral portion of the wafer W without revolving the brushing section 29 on its own axis. When it comes to the rear face washing, however, the brushing section 29 is reciprocated between the central portion and a peripheral portion of the wafer W while revolving the brushing section 29 on its own axis so as to remove completely the foreign matter strongly adhered to the rear face of the wafer W.

Where a mechanical chuck mechanism such as Bernoulli's chuck mechanism is employed in the spin chuck 21, a periphery of the wafer is held by the chuck, with the result that the film quality on the wafer surface is not adversely affected. However, in the case of employing a vacuum suction system in the spin chuck 21, the film quality on the sucked surface of the wafer W tends to be adversely affected. Such being the situation, it is desirable to determine appropriately the chuck system of the spin chuck 21 in each of the front face washing and the rear face washing. Specifically, a vacuum suction system and a mechanical chuck system should be employed in the front face washing and the rear face washing, respectively. Alternatively, a mechanical chuck system should be employed in each of the front face washing and the rear face washing. In this case, however, the rear face washing should be performed first, followed by performing the front face washing. If the front face washing is performed after the rear face washing, the film quality on the front face of the wafer W is unlikely to be adversely affected.

In washing the front face of the wafer W by using the washing apparatus 7, the wafer W is taken out of the cassette C in the cassette station 2 by the sub-arm mechanism 3. The sub-arm mechanism 3 holding the wafer W is moved to a wafer-delivering position where the wafer W is aligned and, then, delivered to the main arm mechanism 5. The subsequent steps are dependent on whether to perform the front face washing alone or whether to perform the front face washing and the rear face washing consecutively.

The wafer W held by the main arm mechanism 5 is loaded into the washing apparatus 7 through the door 27, which is opened, and moved to a position above the spin chuck 21. Then, the main arm mechanism 5 is moved downward to permit the wafer W to be delivered onto the spin chuck 21, followed by moving the main arm mechanism 5 out of the washing apparatus 7 and closing the door 27. At the same time, the cup 28 is moved upward to surround the wafer W. In this step, the spin chuck 21 holds the wafer W in a horizontal posture with the front face forming the upper surface. For example, the Bernoulli effect is utilized for holding the wafer W. The wafer W held by the spin chuck 21 is revolved on its own axis by the spin chuck 21. Under this condition, a washing liquid is supplied from the nozzle 22 to a predetermined position near the center of the wafer W held by the spin chuck 21. As a result, the washing liquid is centrifugally spread over the entire surface region of the wafer W to achieve a uniform washing.

In the next step, the scrubber mechanism 23 is operated to scrub the entire front face of the wafer W. Specifically, the driving shaft 42 included in the scrubber mechanism 23 in its waiting position is moved upward to upheave the sponge 33 forming the lower portion of the brushing section 29. Then, the driving shaft 42 is rotated to swing the arm 30a in the counterclockwise direction (CCW) so as to move the brushing section 29 to a position above the wafer W such that the brushing section 29 is positioned in the center of the wafer W when viewed from above. Under this condition, the brushing section 29 is revolved on its own axis and moved downward to permit the sponge 33 to be brought into contact with the wafer surface.

In the next step, the arm 30a is swung in the clockwise direction (CW) to move the brushing section 29 from the center toward a periphery of the wafer W which is kept revolved on its own axis. In this fashion, the sponge 33 of the brushing section 29 is brought into contact with the entire region of the front face of the wafer W so as to wash the entire region of the front face of the wafer W.

Figure 16:
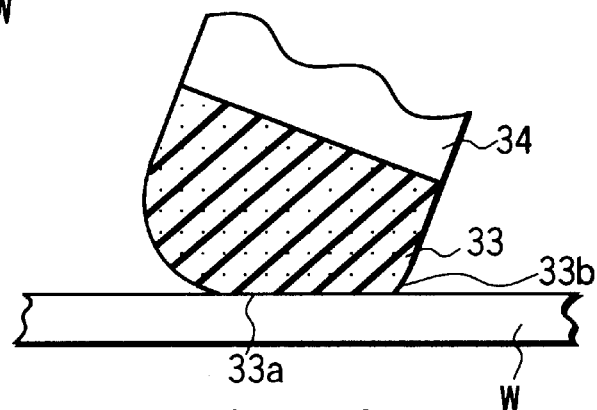
FIG. 16 shows how an inclined scrubbing member is in contact with a wafer.

It should be noted that the lower abutting portion 33a of the sponge 33 is hemispherical. As a result, the contact pressure of the sponge 33 with the wafer surface can be kept constant even if the arm 30a of the scrubbing mechanism 23 is somewhat inclined, as shown in FIG. 16, making it possible to wash uniformly the entire front face of the wafer W. Also, the non-contact peripheral portion 33b is not included in the lower abutting portion 33a of the sponge 33 and, thus, the contact pressure is not excessively increased locally in the sponge 33. It follows that the sponge 33 is prevented from being severely stained locally.

After the brushing operation, revolution of the brushing section 29 is stopped, followed by moving the driving shaft 42 upward so as to upheave the brushing section 29. Then, the driving shaft 42 is rotated to swing the arm 30a in the clockwise direction (CW) so as to move the brushing section 29 to a position above the brushing section cleaning device 24, followed by moving downward the driving shaft 42 to permit the brushing section 29 to be brought back to its waiting position in which the sponge 33 fits inside the brushing section cleaning device 24. Under this condition, a washing liquid is supplied from the nozzle 40 into the washing liquid reservoir 39, and the ultrasonic oscillator 38 is operated so as to wash the sponge 33 itself in the presence of an ultrasonic wave. Since the sponge 33 is washed in its waiting position, the washing apparatus 7 is capable of performing the washing operation of the wafer W effectively. During the sponge washing operation described above, the washing liquid is supplied from the nozzle 40 into the reservoir 39. Incidentally, the sponge 33 can be washed more effectively, if a washing liquid is also supplied from the nozzle 35 to allow the washing liquid to flow from inside the sponge 33 toward the outside so as to effectively remove the dust or the like from the sponge surface. Upon completion of the washing of the sponge 33, the megasonic nozzle 26 is operated so as to wash again the entire wafer surface with a washing liquid excited by an ultrasonic wave.

When the front face washing is finished, the cup 28 and the door 27 are simultaneously moved downward, and the wafer W is unloaded from the front face washing apparatus 7 by the main arm mechanism 5. Since the front face of the wafer W as unloaded faces upward, the wafer W is inverted in the inverting device 10 to cause the rear face to face upward. Further, the inverted wafer W is loaded in the rear face washing apparatus 8 to have the rear face washed by the brushing fiber bundles 51 and the sponge members 54 of the brushing section 50. The scrubbing member 54 includes an abutting portion 54a which is brought into contact with the wafer W and a non-contact peripheral portion 54b which is not in contact with the wafer W.

During the brushing operation, the contact pressure of the brushing section 50 with the rear face of the wafer W can be kept constant even if the arm supporting the brushing section 50 is somewhat inclined. Since the contact pressure is kept uniform over the entire contact region between the brushing section 50 and the rear face of the wafer W, a desired washing effect can be obtained without fail.

When washing of the front and rear faces of the wafer is finished, the spin chuck supporting the wafer W is rotated at a high speed to centrifugally remove the residual washing liquid from the wafer W and, thus, to dry the wafer W. Then, the wafer W is loaded in the heating device 6 by the main arm mechanism 5 and dried by heating in the heating device 6 at 100° C. for about, for example, 30 seconds. After the drying, the wafer W is delivered by the main arm mechanism 5 onto the sub-arm mechanism 3 and, then, brought back to the cassette C by the sub-arm mechanism 3.

In the embodiment described above, the tip portion of the sponge 33 which is brought into contact with a wafer is shaped hemispherical. As a result, the contact pressure between the sponge 33 of the brushing section 29 and the wafer W can be made uniform over the entire contact region even if the arm 30a supporting the brushing section 29 is somewhat inclined. Also, the tip portion of the sponge 33 has a smooth surface free from a corner portion. It follows that, even if the sponge 33 in contact with the wafer W is inclined, the sponge surface is prevented from being severely stained locally.

Figure 17:
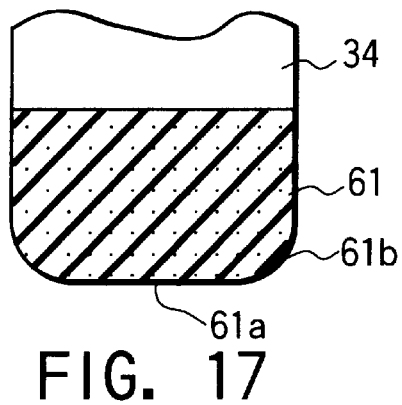
FIG. 17 shows a scrubbing member according to another embodiment of the present invention.

The shape in the tip portion of the sponge 33 is not particularly limited as far as the tip portion projects outward to form a convex configuration. For example, a columnar sponge 61 having a roundish surface in only the lower peripheral portion 616 as shown in FIG. 17 can also be used satisfactorily. The scrubbing member 61 includes an abutting portion 61a which is brought into contact with the wafer W and a non-contact peripheral portion 616 which is not in contact with the wafer W. This is also the case with the sponge used for washing the rear face of the wafer W.

It should also be noted that a washing liquid is supplied to the sponge 33 in its waiting position such that the supplied liquid flows from inside the sponge 33 toward the outside, making it possible to remove effectively the dust or the like attached to the sponge surface, as described previously.

Further, the sponge 33 itself can be washed in the brushing section cleaning device 24 with a washing liquid excited by an ultrasonic wave. It follows that the sponge 33 itself can be kept very clean, leading to a further improved cleaning effect. What should also be noted is that, since the washing with the washing liquid excited by the ultrasonic wave is carried out when the sponge 33 is in its waiting position, the washing efficiency of the wafer can be improved.

Figure 18:
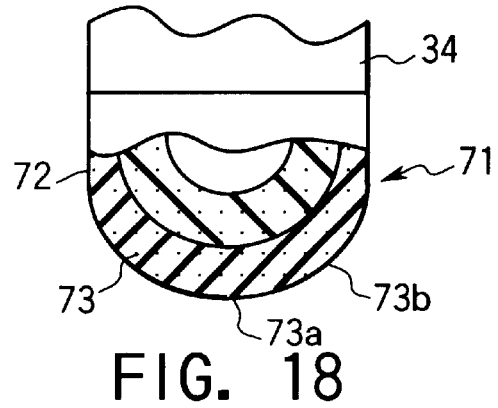
FIG. 18 is a partial cross sectional view showing a scrubbing member according to still another embodiment of the present invention.

Still further, the swelling degree of the sponge 33 can be controlled by controlling the supply pressure of the washing liquid into the inner region of the sponge 33. It follows that the contact pressure between the sponge 33 and the wafer W can be controlled as desired by controlling the supply pressure of the washing liquid into the sponge 33. For facilitating the control of the swelling degree, it is desirable to use a non-permeable material for forming the sponge 33. Alternatively, it is also desirable to use a scrubber 71 of a double layer structure consisting of an inner layer formed of a relatively hard first sponge 72 and an outer layer consisting of a relatively soft second sponge 73, as shown in FIG. 18. The scrubbing member 73 includes an abutting portion 73a which is brought into contact with the wafer W and a non-contact peripheral portion 73b which is not in contact with the wafer W. The first sponge 72 should desirably be formed of a hard material, e.g., PVA or PVF exhibiting an impact resilience of 80 to 90 g/cm$^2$ under 30% of compression stress. Also, the second sponge 73 should desirably be formed of a soft material, e.g., PVA or PVF exhibiting an impact resilience of 20 to 30 g/cm$^2$ under 30% of compression stress.

In the embodiment described above, a semiconductor wafer is washed by scrubbing. However, other substrates such as an LCD substrate can also be washed by scrubbing within the technical scope of the present invention.

As described above, the present invention produces prominent effects. To reiterate, the contact pressure between a scrubber and a substrate surface can be kept constant in the present invention, even if an arm supporting the scrubber is somewhat inclined, making it possible to maintain a desired contact pressure over the entire contact region and, thus, to obtain a desired washing effect without fail.

Also, the scrubbing member has a smooth surface, does not have a corner portion, and is curved in the contact region with the substrate to be washed and in the peripheral region which is not in contact with the substrate. It follows that the scrubbing member is prevented from being severely stained locally even if the contact region is inclined.

Further, the dust or the like attached to the surface of the scrubbing member can be washed away by the washing liquid, making it possible to maintain a high cleanliness of the scrubbing member.

Further, since the swelling degree of the scrubbing member can be controlled by controlling the supply pressure of a washing liquid, it is possible to control the contact pressure between the substrate and the scrubbing member.

Further, since the scrubbing member itself can be washed with a washing liquid excited by an ultrasonic wave, the washing effect of the scrubbing member can be further increased.

Further, since the scrubbing member can be washing when the scrubbing member is in its waiting position, the washing apparatus can be operated efficiently.

Still further, since vibration is imparted to the washing vessel, the scrubbing member can be washed more effectively.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate washing apparatus, comprising:

a spin chuck for holding and rotating a substrate;

a brushing section including a scrubbing member which is brought into contact with a washing surface of said substrate held on said spin chuck and revolved on its own axis together with rotation of the spin chuck. said scrubbing member having a sponge through which a liquid can flow;

a washing liquid supply mechanism having a liquid introducing port for supplying a washing liquid through said brushing section onto said washing surface of the substrate, said liquid introducing port communicating with the sponge of the scrubbing member;

a pressure control mechanism for controlling a pressing force of said scrubbing member against the washing surface of the substrate; and a moving means for moving the scrubbing member relative to the substrate in a radial direction of the substrate, wherein the sponge includes:

an abutting portion which is brought into contact with the washing surface of the substrate;

a non-contact peripheral portion positioned about said abutting portion and formed not to contact the washing surface of the substrate when the abutting portion is in contact with the washing surface of the substrate. said non-contact peripheral portion and the abutting portion forming a curved surface, and whereby the washing liquid supplied by the washing liquid supply mechanism flows from the liquid introducing port through the inner portion of the sponge to swell the sponge, and, then, flows out of the sponge surface, wherein said brushing section includes a holder for holding said scrubbing member and a shaft joined to said holder for revolving the scrubbing member on its own axis, wherein cleansing means, positioned apart from said spin chuck, are configured for washing the scrubbing member while the scrubbing member is in its waiting position, wherein said cleansing means includes a washing vessel receiving a washing liquid and a cleaner member abutting against the scrubbing member revolving on its own axis for cleansing the scrubbing member.

2. The substrate washing apparatus according to claim 1, wherein each of said abutting portion and said non-contact peripheral portion of the sponge is curved in three dimensional directions to form a convex configuration.

3. The substrate washing apparatus according to claim 1, wherein each of said abutting portion and said non-contact peripheral portion of the sponge is shaped to form a hemispherical or pseudo hemispherical configuration.

4. The substrate washing apparatus according to claim 1, wherein said non-contact peripheral portion of the sponge is formed integral with said abutting portion.

5. The substrate washing apparatus according to claim 1, wherein said non-contact peripheral portion of the sponge consists of a plurality of divided regions.

6. The substrate washing apparatus according to claim 1, wherein said sponge includes an inner sponge member receiving the washing liquid supplied from said washing liquid supply mechanism, and an outer sponge member softer than said inner sponge member.

7. The substrate washing apparatus according to claim 1, wherein said scrubbing member further comprise a plurality of brushing fiber bundles.

8. The substrate washing apparatus according to claim 1, wherein said cleaner member is an inclined plate arranged within said washing vessel.

9. The substrate washing apparatus according to claim 1, wherein said cleaner member is a block having a recess capable of housing the scrubbing member within the washing vessel.

10. The substrate washing apparatus according to claim 1, wherein said cleansing means further includes an ultrasonic wave oscillator for applying an ultrasonic wave to the washing liquid within the washing vessel.

11. The substrate washing apparatus according to claim 1, wherein said washing liquid supply mechanism includes a pressure control valve for variably controlling the supply pressure of the washing liquid.

12. The substrate washing apparatus according to claim 1, further comprising control means for controlling the pressure control mechanism so as to control the pressing force of the scrubbing member against the substrate depending on the kind of the washing surface of the substrate.

13. The substrate washing apparatus according to claim 1, further comprising a lower liquid receptacle communicating with each of said liquid introducing port and the sponge to permit the washing liquid to permeate the sponge.

* * * * *